United States Patent [19]
Giacomini

[11] Patent Number: 6,016,078
[45] Date of Patent: Jan. 18, 2000

[54] LOW OFFSET OUTPUT STAGE FOR PRECISION COMPARATORS

[75] Inventor: Davide Giacomini, Valdengo, Italy

[73] Assignee: STMicroelectronics S.r.l., Agrate Brianza, Italy

[21] Appl. No.: 09/152,846

[22] Filed: Sep. 14, 1998

[30] Foreign Application Priority Data

Sep. 25, 1997 [IT] Italy .................................. VA97A0031

[51] Int. Cl.⁷ ....................................................... H03F 3/45
[52] U.S. Cl. ............................................ 330/253; 330/301
[58] Field of Search .................................... 330/255, 253, 330/257, 261, 301

[56] References Cited

U.S. PATENT DOCUMENTS

| | | | |
|---|---|---|---|
| 4,585,961 | 4/1986 | Daubert ................................... | 307/491 |
| 4,866,312 | 9/1989 | Kearney et al. ......................... | 307/496 |
| 5,349,304 | 9/1994 | Ryat ........................................ | 330/253 |
| 5,381,113 | 1/1995 | Kimura ................................... | 330/253 |
| 5,907,259 | 5/1999 | Yamada et al. ......................... | 327/563 |

*Primary Examiner*—Benny Lee
*Assistant Examiner*—Henry Choe
*Attorney, Agent, or Firm*—Allen, Dyer, Doppelt, Milbrath & Gilchrist, P.A.

[57] ABSTRACT

A MOS integrated multistage differential single ended amplifier circuit includes an input circuit generating two differential current outputs, and an output circuit. The output circuit includes a current mirror circuit including two current generators and two branches into which are injected two currents each corresponding to a difference between a bias current generated by a respective current generator and a respective differential current output of said input circuit. The output circuit also includes two diode-connected MOS transistors forming respective current mirrors with the two current generators through which the differential output currents are respectively forced, mirroring the differential output currents on the current generators, respectively, and with a certain mirroring ratio. Two voltage reference MOS transistors are also provided having gates connected to injection nodes of the differential output currents on the diode-connected MOS transistors. A load transistor is also provided for the current mirror. A gate of each of the voltage reference MOS transistors may be dimensioned to make a sum of currents flowing therethrough corresponding to a sum of the signal currents in the branches of the current mirror circuit of the output stage divided by twice a mirroring ratio between the load transistor and the diode-connected MOS transistor of said current mirror circuit.

3 Claims, 3 Drawing Sheets

LOW OFFSET OUTPUT STAGE FOR PRECISION COMPARATORS

FIELD OF THE INVENTION

The present invention relates to differential amplifiers in general, and, more particularly, to differential amplifiers integrated in MOS technology.

BACKGROUND OF THE INVENTION

With the improving of the available technologies and the demand for ever increasing precision, it is of ever increasing importance to realize circuits wherein the precision with which a certain factor, parameter or entity is controlled or delivered be constant. This should be so despite the varying of numerous others parameters such as temperature, supply voltage, bias current, etc.

Operational amplifiers and more specifically error amplifiers or differential comparators are truly building blocks of complex systems for analog processing of signals. Differential amplifiers, if considered, for example, in their function as error amplifiers, are intuitively the kind of circuits for which a great precision is a fundamental requirement. Therefore hereinafter reference will be made simply by way of an example to a differential comparator with null threshold voltage, also referred to as a zero cross comparator, as representing one of the most typical differential amplifier circuits requiring a high precision despite varying operating conditions, such as temperature, supply voltage, bias current, etc.

FIGS. 1 and 2 show the two stages or more precisely the input part and the output part, respectively, of a common zero comparator. The zero comparator has a substantially null threshold, and is integrated in MOS technology. It employs an output NAND gate comprising transistors M26, M27, M33 and M47, which are enabled or disabled by way of a logic signal en.

The input stage of FIG. 1 is not directly involved or pertinent to the subject matter of the present invention or to the physical implementation of the circuit components that realize the circuit of the invention, however it is reproduced for the sake of completeness of illustration. The input stage of FIG. 1 has a quite common circuit configuration according to an implementation with MOS transistors of complementary types. Accordingly, the circuit can function from ground up to the supply voltage.

FIG. 2 depicts the output stage of the comparator, that is, the part that is directly involved in implementing the circuit of the present invention. Referring to FIG. 1, the two lines diffA and diffB represent the two differential output lines of the input stage of complementary symmetry. Therefore, the two currents Ia1 and Ib1 are equal when the two inputs (+) and (−) of the comparator are at the same voltage.

Generally, by assuming that Ia1=Ib1=I and considering the output circuit block of FIG. 2, the current Ia2 and Ib2 are obtained by the difference between the drain currents of the transistors M19 and M64 and the output currents of the input circuit Ia1 and Ib1, which according to the initial assumption, are both equal to I. The transistors M19 and M64 provide two generators of a constant bias current for the two branches of the current mirror circuit provided by M5 and M6, which includes also a level shifting circuit. A constant bias current is provided because M19 and M64 provide the strong sides of a current mirror having as its reference the biasing diode M20 of the input circuit.

To achieve the maximum voltage swing without wasting current it may be assumed normally that $I_{dM19}=I_{dM64}=$Ia1+Ib1=2I. Therefore in a balanced condition of the inputs: Ia2=Ib2=I. These currents flow toward a respective active load, represented by the transistors M5 and M6 of a current mirror circuit that drives a load transistor M71. The potential level of the load transistor M71 is referred to another transistor M69 connected between the ground node and the output node of the output stage.

If, as in the above described example, the transistor M71 has a gate length double that of the transistors M5 and M6, with identical currents, it will deliver Ic=I/2. To match the circuit it will be necessary to cause the transistor M65 to generate a current Ica=I/2. For this reason, its width (w) must be equal to half the width of the biasing reference diode M20.

It has been observed that in a classical circuit as the one depicted in FIGS. 1 and 2, the maximum band of the circuit, from which the speed of the comparator depends, is limited by the output band of the active load. Therefore, the output band is limited by the band available on the drain node of M6, to which the gate M71 is coupled.

To increase the useful band, the sizes of these transistors may be reduced. Once the minimum size permitted by the fabrication technology is reached, the only way to increase the band is to increase the signal currents Ia2 and Ib2 of the output stage. In fact, an increase of just the bias currents of the two branches for the currents $I_{dM19}$ and $I_{dM64}$, does not have any effect on the band because the input signal acts by way of Ia1 and Ib1, Therefore, to increase the band it is necessary to increase Ia1=Ib1=I and by consequence also $I_{dM19}=I_{dM64}=$Ia1+Ib1=2I, to maintain unchanged the dynamic characteristics of the circuit.

On the other hand, through the biasing diode M20, the circuit is affected by the body effect of the transistors M21 and M3 that generate the bias currents of the input circuit. These currents increase upon an increase of the supply voltage that increases the Vds of the above-mentioned MOS transistors M21 and M3.

In contrast, the transistors M19 and M64 are not so affected because their drains are fixed at the voltage imposed by the voltage shifting stage provided by M68 and M67. On the other hand, it would be counterproductive to remove such a voltage shifting stage because another source of error would be introduced in the mirrored currents.

Therefore, the transistor M69 mirrors M20 directly without being affected by the variation of the currents $I_{dM21}$ and $I_{dM3}$. Moreover, it is subjected to a different Vds voltage than that of the respective transistors, and, therefore, causes an error because of a different body effect. As a consequence, upon the varying of the input voltage and even of the operating point of the inputs (+) and (−), the offset of the comparator shifts appreciably giving rise to threshold error.

SUMMARY OF THE INVENTION

It is an object of the present invention effectively overcome the problem of a change of the offset of the comparator upon the varying of the input voltage and of the operating point of the inputs, by adding a relatively low number of additional MOS devices.

The invention broadens the band of the comparator without increasing the level of the differential output currents of the input circuit. The invention thus reduces current absorption and maintains the offset of the comparator fixed. This is done by preventing a changing body effect on the complementary current generators of the input circuit from being translated into an increment of the offset.

BRIEF DESCRIPTION OF THE DRAWINGS

The different aspects and advantages of the invention will be more easily understood through the following description of an embodiment, referred for sake of simplicity of explanation to the case of a null threshold comparator, a sample embodiment of which according to a known technique has already been described above, and by referring to the attached drawings, wherein.

DETAILED DESCRIPTION OF THE PREFERRED EMBODIMENTS

Figure 2:
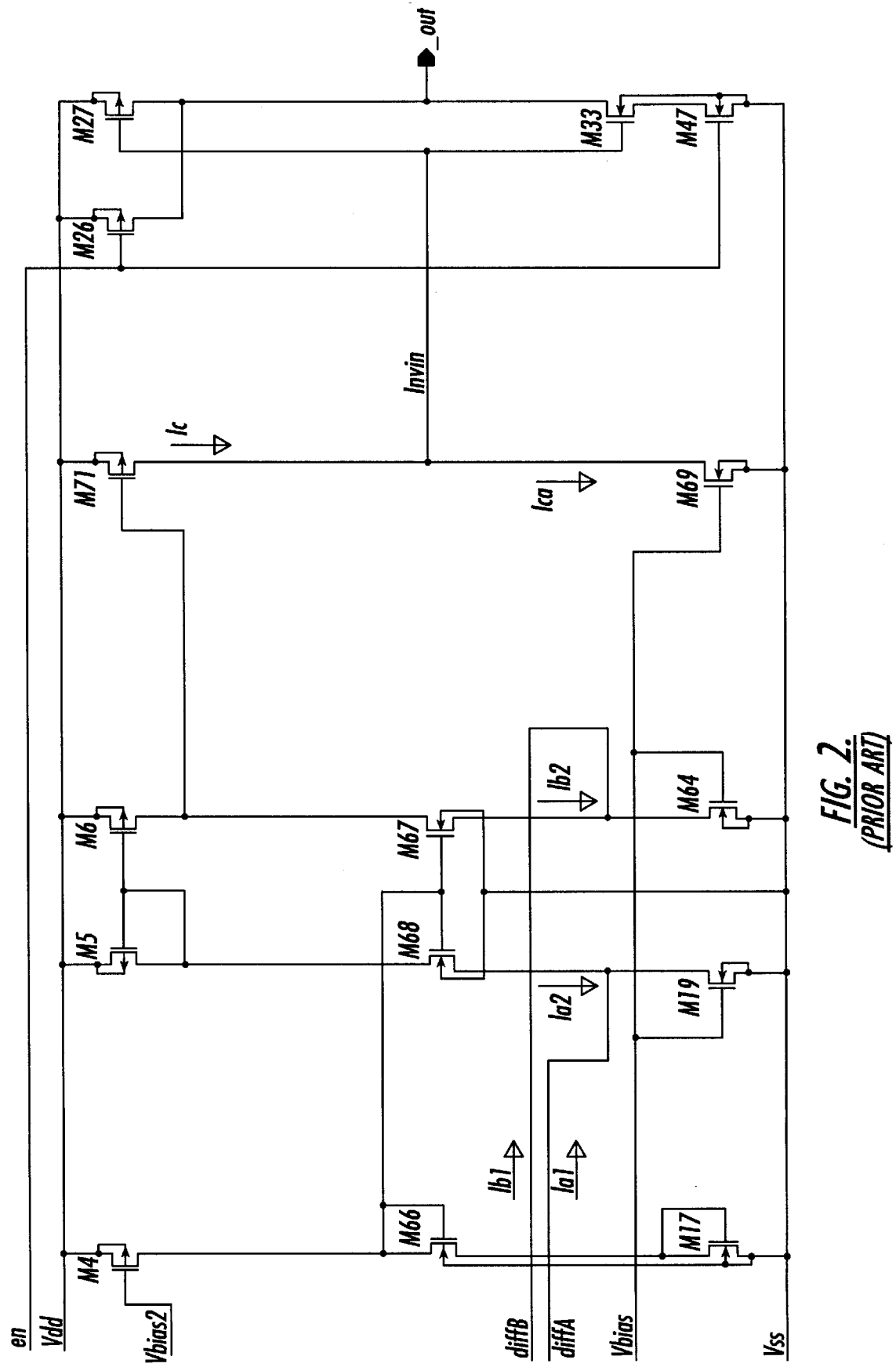
FIG. 2 shows, as already described above, the output circuit of the comparator made according to a known technique of the prior art.
Figure 3:
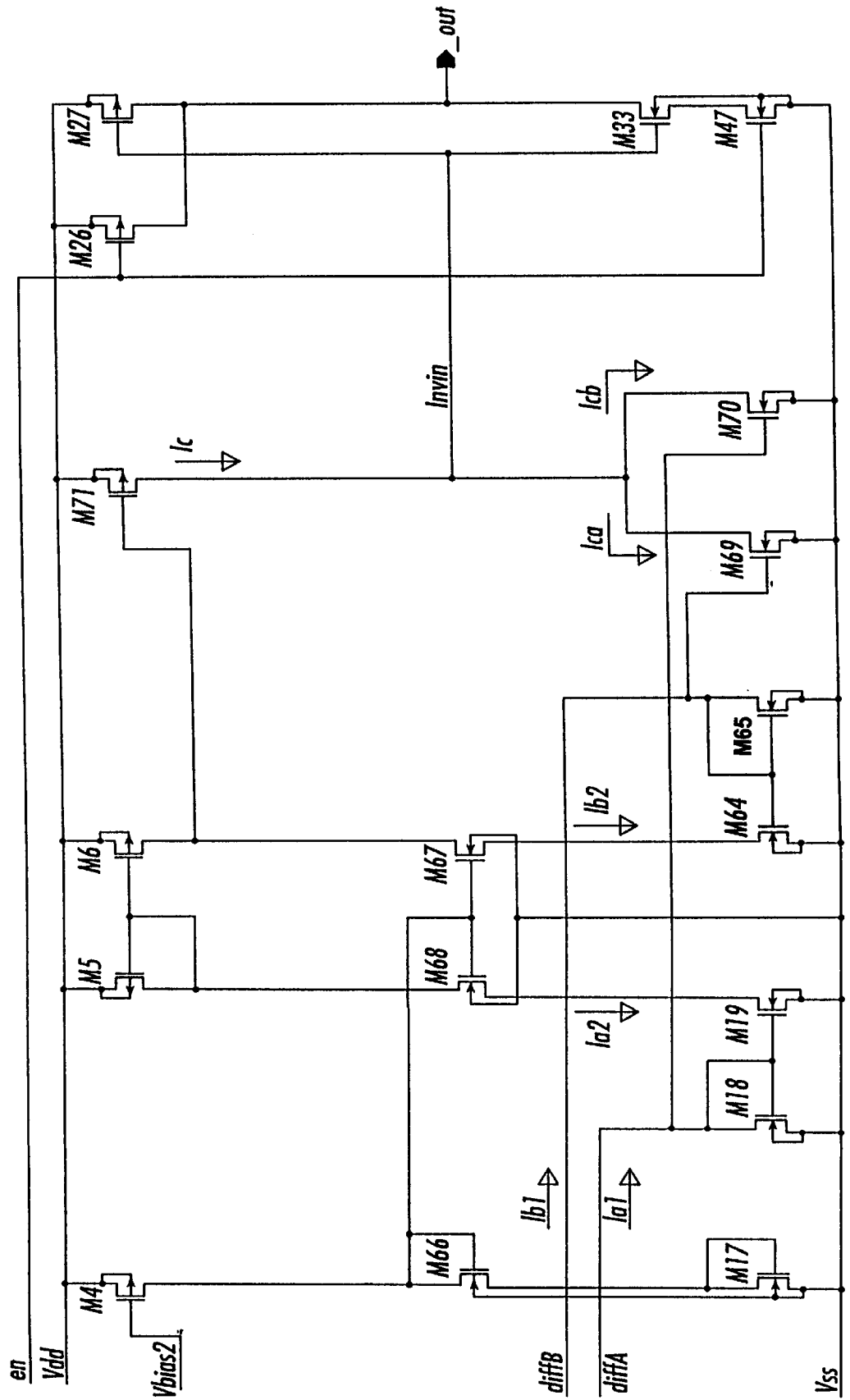
FIG. 3 shows the output circuit modified according to the present invention.

By referring to the circuit diagram of FIG. 3, the signal lines diffA and diffB, contrary to the classical scheme depicted in FIG. 2, are coupled to two additional MOS transistors M18 and M65, connected in a diode configuration and referred to ground potential. The differential output currents Ia1 and Ib1 of the input circuit are mirrored on the same branches of the current mirror circuit of the known circuit diagram, provided by the MOS transistors 5 and 6, and on the respective active load represented by the MOS transistor M71. However the circuit modified according to the present invention as depicted in FIG. 3 achieves the following advantages.

Figure 1:
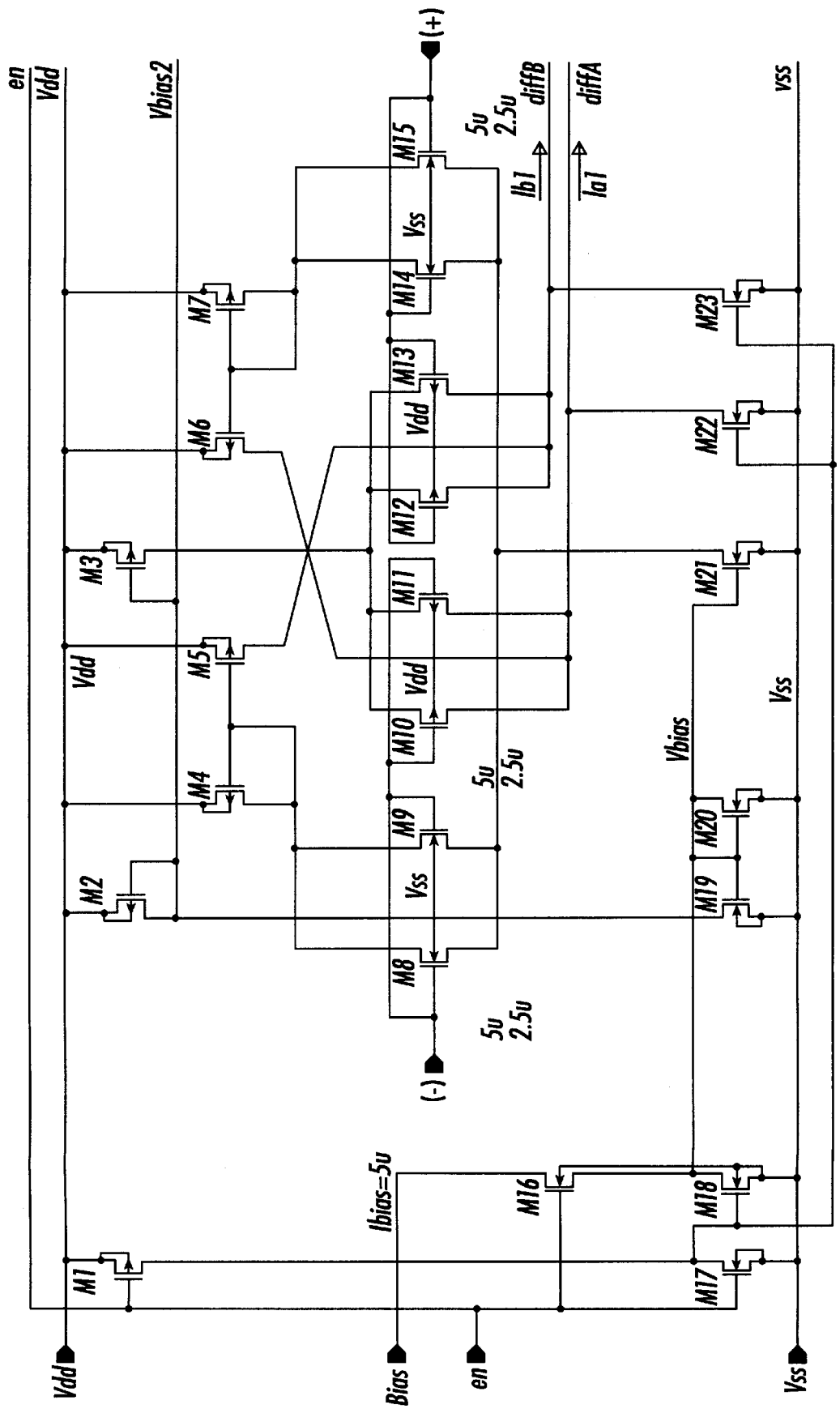
FIG. 1 shows, as already mentioned above, a complementary symmetry differential input circuit according to the prior art.

For increasing the useful band of the comparator it is, of course, necessary to increase the signal currents Ia2 and Ib2 in the two branches of the current mirror circuit of the output stage. However, according to the modified circuit of the invention this may be achieved simply by increasing the mirror ratio of the two pairs of MOS mirrors that are realized by adding two diode-connected MOS transistors M18 and M65, by increasing, for example, the gate width of M19 and M64. Therefore, the currents Ia1 and Ib1 remain unchanged while the currents $I_{dM19}=I_{dM64}$ increase. For example, instead of doubling the level of the differential output current Ia1 and Ib1 of the input stage, and, therefore, also of Ia2 and Ib2 as in the case of the known circuit of FIGS. 1 and 2, it is possible to double only the currents $Ia2=I_{dM19}$ and $Ib2=I_{dM64}$, thus saving current.

Any change of the level of the bias current of the input stage (FIG. 1) due to a modification of the body effect on M3 and M21 is in this case sensed by transistors M18 and MG5 and proportionally mirrored by employing a pair of transistor M69 and M70 as the reference for the load transistor M71 of the output stage instead of a single transistor M69 as was the case in the known circuit of FIG. 2. In the illustrated embodiment, the sum of the currents of these two transistors (M69 and M70) must be equal to [Ica+Icb]=(Ia2+Ib2)/4. In this way, upon the varying of the voltage difference of the inputs (+) and (−) of the comparator, Ia1 and Ib1 and as a consequence also Ia2 and Ib2 vary, but their sum does not.

For example, to achieve this it is sufficient that the transistors M69 and M70 have the same gate length as the transistors M18 and M19, and as the transistors M64 and M65, respectively, but a gate width of ¼ of the width of M19 and M64 respectively. In this way, a perfect balancing of the output stage is ensured independently of the current entering the "weak" side of the two current mirrors M18–M19 and M65–M64, mentioned above.

The upper part of the output circuit may remain unchanged. In other words, it may be substantially identical to the one of the known circuit of FIG. 2. The output circuit of the invention of FIG. 3 maintains absolutely unchanged the useful characteristics of permitting the common mode of the differential input voltage to drop down to ground potential and even to below ground potential, as in the case of the known circuit of FIG. 2. This is so notwithstanding the fact of including two diode connected MOS transistors M18 and M65 acting as a load on the drain of the transistors of the fully differential input stage. In fact, as long as the input voltage does not drop below ground potential, both the MOS transistors of the input stage, as well as the above mentioned diode configured transistors remain in a saturation zone and the stage functions normally.

When the voltage drops further, these MOS transistors began to pass into a zone of ohmic behavior and the current mirroring is no longer coherent. Though functioning below threshold, the circuit of the invention continues to work properly because both diodes M18 and M65 pass to an ohmic zone of their characteristics at the same common mode voltage. Both MOS transistors M19 and M64 of the "strong" side of the mirrors see the same Vds due to the upper voltage shifter provided by the transistors M68–M67 that are already present in the basic circuit for the above mentioned reasons.

Even if the gate area ratio of the mirrors M18–M19 and M65–MG4 is not correct, the currents Ia2 and Ib2 remain coherent to the differential voltage applied to the input and the comparator may function even down to several hundreds mV below ground potential. Similar considerations, in a substantially dual fashion, are also valid for the case of a common mode input voltage close to the supply voltage.

The circuit arrangement of the invention as described above has been successfully implemented in a single input comparator, as well as in a three-input error amplifier with a comparator-like output. In either applications a 1.2 µm lithographic definition fabrication technology was used.

That which is claimed is:

1. A MOS technology integrated multistage differential single ended amplifier circuit comprising an input circuit composed of two differential input stages (M8, M9, M14, M15, M10, M11, M12, M13, M4, M5, M6, M7) of complementary symmetry provided with biasing means (M20, M19, M2, M3, M21) including two complementary current generators (M3, M21), referred to the supply voltage and to ground potential, respectively, and having two lines of differential output (diffA, diffB), and an output circuit (M5, M6, M67, M68, M19, M64, M69, M71) comprising a current mirror circuit (M5, M6) on the two branches of which are injected currents (Ia2, Ib2), each corresponding to the difference between a bias current generated by a respective current generator (M19, M64) and a respective differential current (Ia1, Ib1) output by said input circuit, through said output lines (diffA, diffB), characterized in that said output circuit further comprises:

two diode-connected MOS transistors (M18, M65), referred to ground potential and forming respective current mirrors with said current generators (M19, M64) of said current mirror circuit, also referred to ground potential, through which said output currents (Ia1, Ib1) are respectively forced, mirroring said output currents (Ia1, Ib1) on said current generators (M19, M64) respectively, with a certain mirroring ratio, and permitting an increase of the signal currents (Ia2, Ib2) through said current mirror circuit (M5, M6) without any increase of said currents (Ia1, Ib1) output by said differential input stages;

the injection nodes of said output currents (Ia1, Ib1) of said input stages on said diode-connected MOS transistors (M18, M65) been coupled to the gates of two MOS transistors (M69, M70), respectively, referred to ground potential, that provide a voltage reference to a single load S transistor (M71) of said current mirror circuit.

2. The amplifier circuit according to claim 1, wherein the size of the gate of said voltage reference MOS transistors (M69, M70) for said single load transistor (M71) of said current mirror circuit are dimensioned to make the sum of the currents flowing there through (Ica+Icb) corresponding to the sum of said signal currents (Ia2, Ib2) in the branches of said current mirror circuit of said output stage divided by twice the mirroring ratio between said load transistor (M71) and the diode (M5) of said current mirror circuit (MS, M6).

3. The amplifier circuit according to claim 2, wherein said current mirror circuit (M5, M6) of the output stage has unitary mirroring ratio, said output currents (Ia1, Ib1) of the input stages are mirrored on said current generators (M19, M64) by way of two mirrors (M18–M19, M64–M65) of identical mirroring ratio.

* * * * *